United States Patent
Bhagavatula et al.

(10) Patent No.: US 9,266,771 B1
(45) Date of Patent: Feb. 23, 2016

(54) ELECTRIC ARC APPARATUS FOR PROCESSING AN OPTICAL FIBER, AND RELATED SYSTEMS AND METHODS

(71) Applicant: CORNING OPTICAL COMMUNICATIONS LLC, Hickory, NC (US)

(72) Inventors: Venkata Adiseshaiah Bhagavatula, Big Flats, NY (US); John Himmelreich, Horseheads, NY (US)

(73) Assignee: Corning Optical Communications LLC, Hickory, NC (US)

( * ) Notice: Subject to any disclaimer, the term of this patent is extended or adjusted under 35 U.S.C. 154(b) by 0 days.

(21) Appl. No.: 14/529,670

(22) Filed: Oct. 31, 2014

Related U.S. Application Data

(60) Provisional application No. 62/031,233, filed on Jul. 31, 2014.

(51) Int. Cl.
| | |
|---|---|
| *C03C 25/68* | (2006.01) |
| *C03C 15/02* | (2006.01) |
| *G02B 6/255* | (2006.01) |
| *H01L 21/302* | (2006.01) |

(52) U.S. Cl.
CPC .............. *C03C 15/02* (2013.01); *G02B 6/2551* (2013.01); *G02B 6/2552* (2013.01); *H01L 21/302* (2013.01)

(58) Field of Classification Search
CPC ... G02B 6/2551; G02B 6/2552; H01L 21/302
USPC ............................................ 216/7, 24, 67, 71
See application file for complete search history.

(56) References Cited

U.S. PATENT DOCUMENTS

| | | | |
|---|---|---|---|
| 4,135,781 A | 1/1979 | Archer | 350/96.2 |
| 5,226,101 A | 7/1993 | Szentesi et al. | 385/85 |
| 6,768,837 B1 * | 7/2004 | Thual et al. | 385/33 |
| 7,317,171 B2 | 1/2008 | Wiley | 219/121.59 |
| 7,342,198 B2 | 3/2008 | Wiley | 219/121.59 |
| 7,555,188 B2 | 6/2009 | Wiley et al. | 385/134 |

(Continued)

FOREIGN PATENT DOCUMENTS

| | | | | |
|---|---|---|---|---|
| CA | 2479863 A1 | 2/2006 | | G02B 6/00 |
| JP | 1995098421 A | 4/1995 | | G02B 6/255 |

(Continued)

OTHER PUBLICATIONS

Wikipedia, The Free Encyclopedia, "Electric Arc" via http://web.archive.org/web/20120815105843/http://en.wikipedia.org/wiki/Electric_arc ; pp. 1-6; May 2012.*

*Primary Examiner* — Binh X Tran

(57) ABSTRACT

An electric arc apparatus for processing an optical fiber includes one or more first electrodes and one or more second electrodes. The first electrode(s) each have an end portion that terminates at an opening defined by the first electrode(s). The opening is configured to accommodate the optical fiber extending along a longitudinal axis. The second electrode(s) each have an end portion that terminates at a location spaced from the opening defined by the first electrode(s). The first electrode(s) or second electrode(s) are configured to receive a voltage that generates a plasma field between the first electrode(s) and second electrode(s), which are shaped to focus the plasma field so that the plasma field extends across the longitudinal axis and modifies the end of the optical fiber. Methods of processing an optical fiber with an electric arc apparatus are also disclosed.

18 Claims, 7 Drawing Sheets

(56) References Cited

U.S. PATENT DOCUMENTS

| | | |
|---|---|---|
| 7,670,065 B2 | 3/2010 | Clark et al. .................. 385/96 |
| 7,922,400 B2 | 4/2011 | Clark et al. .................. 385/96 |
| 7,985,029 B2 | 7/2011 | Wiley et al. .................. 385/96 |
| 8,132,971 B2 | 3/2012 | Luther et al. .................. 385/83 |
| 8,721,196 B2 | 5/2014 | Wiley et al. .................. 385/96 |
| 2005/0207706 A1 | 9/2005 | Schmidt et al. .............. 385/55 |
| 2007/0031098 A1* | 2/2007 | Wiley et al. ................. 385/134 |
| 2007/0284767 A1 | 12/2007 | Kashyap .................. 264/1.24 |
| 2010/0065535 A1 | 3/2010 | Zheng et al. ............ 219/121.38 |
| 2012/0183266 A1 | 7/2012 | Wiley et al. .................. 385/96 |
| 2014/0064665 A1* | 3/2014 | Ott et al. .................. 385/60 |

FOREIGN PATENT DOCUMENTS

| | | | | |
|---|---|---|---|---|
| JP | 1998268162 A | 10/1998 | ............ | G02B 6/42 |
| JP | 2000292648 A | 10/2000 | ............ | G02B 6/36 |
| JP | 2003270449 A | 9/2003 | ............ | G02B 6/00 |
| JP | 2004061672 A | 2/2004 | ............ | G02B 6/10 |
| JP | 2005241702 A | 9/2005 | ............ | G02B 6/36 |
| JP | 2009258289 A | 11/2009 | ............ | G09G 5/24 |
| WO | WO2011087508 A1 | 7/2011 | ............ | G02B 6/25 |
| WO | WO2014072908 A1 | 5/2014 | ............ | G02B 6/255 |

* cited by examiner

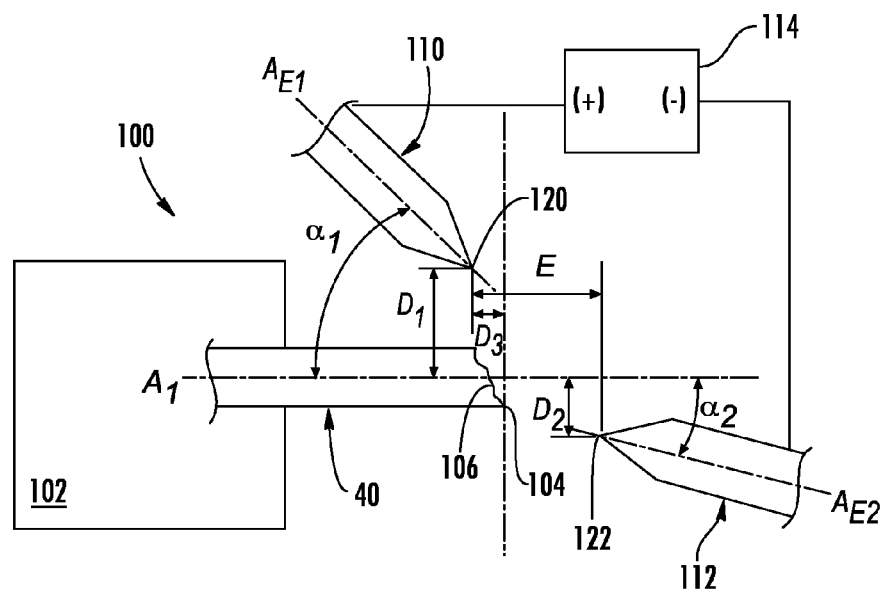
FIG. 6
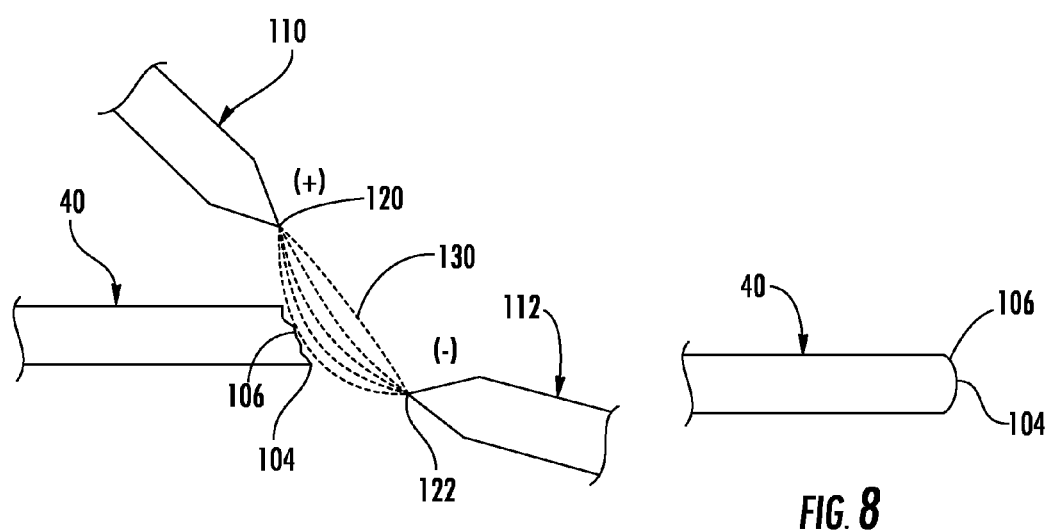
FIG. 7
FIG. 8

ELECTRIC ARC APPARATUS FOR PROCESSING AN OPTICAL FIBER, AND RELATED SYSTEMS AND METHODS

CROSS-REFERENCE TO RELATED APPLICATIONS

This application claims the benefit of priority under 35 U.S.C. §119 of U.S. Provisional Application Ser. No. 62/031,233, filed on Jul. 31, 2014, the content of which is relied upon and incorporated herein by reference in its entirety.

BACKGROUND

This disclosure relates generally to optical fibers, and more particularly to electric arc apparatuses for processing optical fibers, and related systems and methods.

Optical fibers are useful in a wide variety of applications, including the telecommunications industry for voice, video, and data transmissions. In a telecommunications system that uses optical fibers, there are typically many locations where fiber optic cables that carry the optical fibers connect to equipment or other fiber optic cables. To conveniently provide these connections, fiber optic connectors are often provided on the ends of fiber optic cables. The process of terminating individual optical fibers from a fiber optic cable is referred to as "connectorization." Connectorization can be done in a factory, resulting in a "pre-connectorized" or "pre-terminated" fiber optic cable, or the field (e.g., using a "field-installable" fiber optic connector).

Regardless of where installation occurs, a fiber optic connector typically includes a ferrule with one or more bores that receive one or more optical fibers. The ferrule supports and positions the optical fiber(s) with respect to a housing of the fiber optic connector. Thus, when the housing of the fiber optic connector is mated with another connector or an adapter, an optical fiber in the ferrule is positioned in a known, fixed location relative to the housing. This allows an optical connection to be established when the optical fiber is aligned with another optical fiber provided in the mating component (i.e., the other connector or an adapter).

The ferrule bore in a fiber optic connector may extend from a rear of the ferrule to a front of the ferrule. With such a design, an optical fiber can be passed through the ferrule so as to extend beyond an end face of the ferrule. After securing the optical fiber relative to the ferrule by using a bonding agent or the like, an optical surface (i.e., an end surface/facet intended for optical coupling) may be formed on the optical fiber. The optical surface is typically formed a precise distance from the end face of the ferrule according to very tight dimensional standards to reduce signal attenuation. For example, the final optical surface of the optical fiber may be within 200 nm of the end face of the ferrule.

One conventional method of forming an optical surface involves a mechanical cleaving step followed by several mechanical polishing steps. Such methods can be time-consuming and labor-intensive due to the number of polishing steps required to precisely control material removal and meet the tight dimensional requirements. For example, it may be necessary to begin with coarse grit when mechanically polishing and gradually switch to finer grits in subsequent polishing steps to carefully control the protrusion of the optical fiber from the end face of the ferrule and to form an optical surface of high quality. Mechanical polishing processes can be time-consuming, labor-intensive, and use a large amount of consumables. Additionally, these processes sometimes suffer from low yields due to human error.

Various techniques for cleaving and polishing an optical fiber with non-mechanical means, such as with lasers or electric arcs, are also known. Although these techniques may help reduce or eliminate some of the polishing steps associated with mechanical processing, there remains room for improvement.

SUMMARY

Embodiments of an electric arc apparatus for processing an optical fiber are disclosed below. It should be noted that "an optical fiber" refers to "at least one optical fiber," as the electric arc apparatuses disclosed may be used to process multiple optical fibers.

According to one embodiment, the electric arc apparatus includes a body defining a space configured to accommodate the optical fiber extending along a longitudinal axis. The electric arc apparatus also includes one or more first electrodes and one or more second electrodes. The one or more first electrodes are coupled to or integrally formed with the body, and each terminates at a first location spaced from the longitudinal axis. The one or more second electrodes each terminates at a second location spaced from the first location in direction along or parallel to the longitudinal axis. The one or more first electrodes or one or more second electrodes are configured to receive a voltage that generates an plasma field between the first and second locations, and the first and second locations are positioned so that the plasma field intersects the longitudinal axis when the plasma field is generated. Optionally, the first electrode(s) each at least partially converge before terminating at the first location, and/or the second electrode(s) each at least partially converges before terminating at the second location.

According to another embodiment, an electric arc apparatus includes one or more first electrodes each having an end portion terminates at an opening defined by the one or more first electrodes. The opening is configured to accommodate the optical fiber extending along a longitudinal axis. The electric arc apparatus also includes one or more second electrodes each having an end portion that terminates at a location spaced from the opening defined by the one or more first electrodes. The one or more first electrodes or one or more second electrodes are configured to receive a voltage that generates a plasma field between the one or more first electrodes and the one or more second electrodes. Additionally, the one or more first electrodes and the one or more second electrodes are shaped to focus the plasma field so that the plasma field extends across the longitudinal axis and modifies the end of the optical fiber. Optionally, this may be achieved by the end portion(s) of the one or more first electrodes each at least partially converging before terminating at the opening, and by the end portion(s) of the one or more second electrodes each at least partially converging before terminating at the location spaced from the opening.

Methods of processing an optical fiber using an electric arc apparatus are also disclosed. The electric arc apparatus may be one of those mentioned above, for example. One embodiment of such a method involves extending the optical fiber along the longitudinal axis, positioning an end of the optical fiber closer to the one or more first electrodes than to one or more second electrodes, providing a voltage to the one or more first electrodes or the one or more second electrodes to generate a plasma field, wherein the plasma field modifies the end of the optical fiber.

According to another embodiment, a method of processing an optical fiber with an electric arc apparatus involves extending the optical fiber along a longitudinal axis, wherein one or more first electrodes of the electric arc apparatus each terminates at a first location spaced from the longitudinal axis. An end of the optical fiber is positioned closer to the one or more first electrodes than to one or more second electrodes of the electric arc apparatus. The one or more second electrodes each terminates at a second location that is spaced from the first location in a direction along or parallel to the longitudinal axis. The method also involves providing a voltage to the one or more first electrodes or the one or more second electrodes to generate a plasma field between the first and second locations. The first and second locations are positioned so that the plasma field intersects the longitudinal axis, and the plasma field modifies the end of the optical fiber.

According to another embodiment, a method of processing an optical fiber involves extending the optical fiber along a longitudinal axis, wherein the longitudinal axis extends through an opening defined by one or more first electrodes of an electric arc apparatus. The one or more first electrodes each have an end portion that terminates at the opening. The method also involves positioning an end of the optical fiber closer to the one or more first electrodes than to one or more second electrodes of the electric arc apparatus. The one or more second electrodes each have an end portion that terminates at a location spaced from the opening defined by the one more first electrodes. A voltage is provided to the one or more first electrodes or the one or more second electrodes to generate a plasma field between the one or more first electrodes and the one or more second electrodes. The plasma field is focused by the one or more first electrodes and the one or more second electrodes so that the plasma field extends across the longitudinal axis and modifies the end of the optical fiber.

Additional features and advantages will be set forth in the detailed description which follows, and in part will be readily apparent to those skilled in the technical field of optical communications. It is to be understood that the foregoing general description, the following detailed description, and the accompanying drawings are merely exemplary and intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the description serve to explain principles and operation of the various embodiments. Features and attributes associated with any of the embodiments shown or described may be applied to other embodiments shown, described, or appreciated based on this disclosure.

FIG. 6 is a schematic view of one embodiment of an electric arc apparatus that may be used to process an optical fiber;

FIG. 7 is a schematic view similar to FIG. 6, but illustrating the electric arc apparatus generating a plasma field to modify an end of the optical fiber;

FIG. 8 is a schematic view of the optical fiber of FIGS. 6 and 7 after having been processed with the electric arc apparatus;

DETAILED DESCRIPTION

Figure 1:
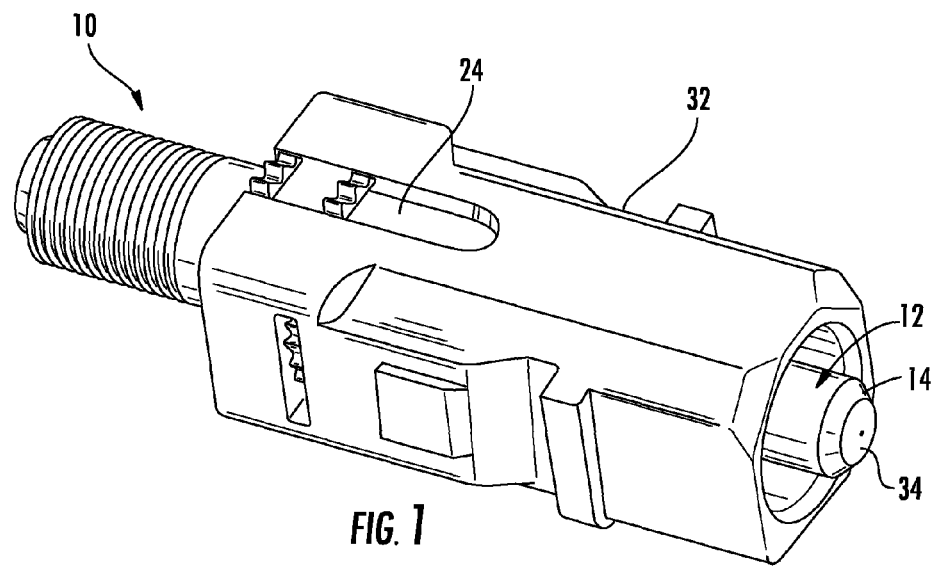
FIG. 1 a perspective view of an example of a fiber optic connector.

Various embodiments will be further clarified by examples in the description below. In general, the description relates to devices and methods processing an optical fiber. The processing may be part of terminating one or more optical fibers with a fiber optic connector, either in the field or in a factory, and forming a fiber optic cable assembly. One example of a fiber optic connector ("connector") 10 is shown in FIG. 1. Although the connector 10 is shown in the form of a SC-type connector, the devices and methods described below may be applicable to different connector designs. This includes ST, LC, FC, MU, MT, and MTP-type connectors, for example, and other single-fiber or multi-fiber connector designs. Again, the description below relates to processing an optical fiber that is to be used in a fiber optic connector rather than a fiber optic connector itself. A general overview of the connector 10 will be provided simply to facilitate discussion, as one or more components of the connector 10 may be referred to when subsequently describing the devices and methods for processing an optical fiber.

Figure 2:
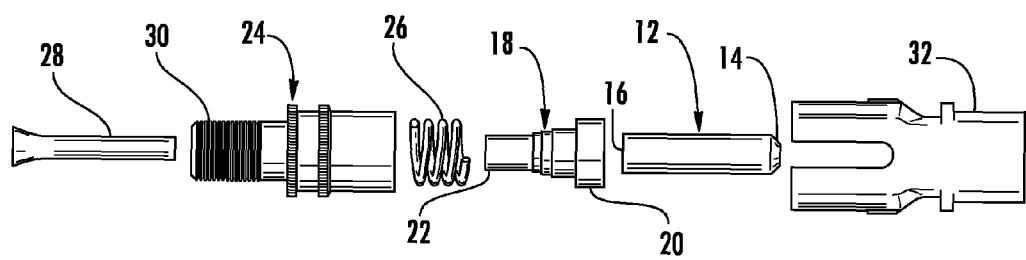
FIG. 2 is an exploded side view the fiber optic connector of FIG. 1.

As shown in FIGS. 1 and 2, the connector 10 includes a ferrule 12 having a front end 14 and rear end 16, a ferrule holder 18 having opposed first and second end portions 20, 22, and a housing 24 (also referred to as an "inner housing" or "connector body"). The rear end 14 of the ferrule 12 is received in the first end portion 20 of the ferrule holder 18, while the front end 14 remains outside the ferrule holder 18. The second end portion 22 of the ferrule holder 18 is received in the housing 24. A spring 26 may be disposed around the second end portion 22 and configured to interact with walls of the housing 24 to bias the ferrule holder 18 (and ferrule 12). Additionally, a lead-in tube 28 may extend from a rear end of the housing 24 to within the second end portion 22 of the ferrule holder 18 to help guide the insertion of an optical fiber (not shown in FIGS. 1 and 2) into the ferrule 12. An outer shroud 32 (also referred to as an "outer housing") is positioned over the assembled ferrule 12, ferrule holder 18, and housing 24, with the overall configuration being such that the front end 16 of the ferrule 12 presents an end face 34 configured to contact a mating component (e.g., another fiber optic connector; not shown).

Figure 3:
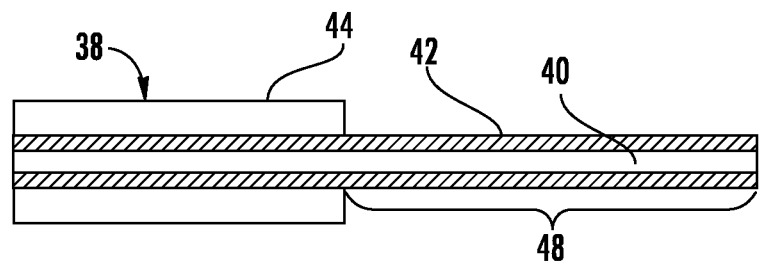
FIG. 3 is a schematic view of a portion of a fiber optic cable that includes an optical fiber, a primary coating applied to the optical fiber, and a tight buffer coating applied to the primary coating, with some of the tight buffer coating having been removed from an end section of the optical fiber and primary coating.

FIG. 3 schematically illustrates an example of a fiber optic cable 38 including an optical fiber 40 upon which the connector 10 may be installed. The optical fiber 40 guides light through a principle known as "total internal reflection," where light waves are contained within a core by a cladding that has a different index of refraction than the core. The core and cladding are not labeled in FIG. 3, but together define the optical fiber 40 and may comprise glass (e.g., germanium-doped silica). One or more coating layers surround the optical fiber 40 to protect the optical fiber 40 from the environment and mechanical loads. In the embodiment shown, a primary coating 42 surrounds the optical fiber 40, and a tight buffer coating 44 surrounds the primary coating 42. The primary coating 42 may be an acrylic polymer or the like and simply be referred to as "the coating". The tight buffer coating 44 may comprise polyvinyl chloride (PVC), polyurethane, polyolefin, or the like, and be referred to as a "tight buffer." The optical fiber 40, primary coating 42, and tight buffer coating 44 represent part of the fiber optic cable 38, which may or may not include other optical fibers.

Figure 4:
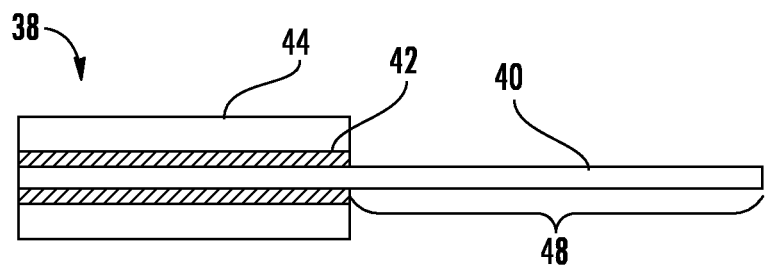
FIG. 4 is a schematic view similar to FIG. 3, but with the primary coating removed from the end section of the optical fiber.
Figure 5:
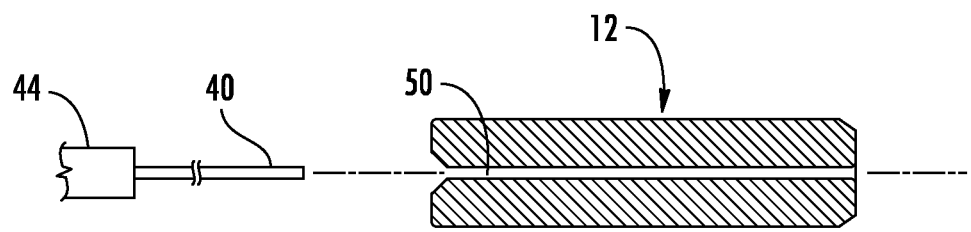
FIG. 5 is a schematic view of the fiber optic cable of FIG. 4 prior to inserting the end section of the optical fiber into a bore of a ferrule.

Typically the primary coating 42 and tight buffer coating 44 are removed from a section of the optical fiber 40 before installing a connector, such as the connector 10. In FIG. 3, the tight buffer coating 44 has been removed (i.e., "stripped") from the primary coating 42 over an end section 48 of the optical fiber 40. In FIG. 4, the primary coating 42 has been removed from the end section 48 of the optical fiber 40 to expose the optical fiber 40. The optical fiber is then ready to be inserted into a bore 50 of the ferrule 12, as shown in FIG. 5. The devices and methods described below may be used to process the optical fiber before or after such insertion. For example, the processing may relate to polishing the optical fiber 40 (i.e., forming an optical surface of a desired quality for optical coupling on an end of the optical fiber 40). The optical fiber 40 may be inserted through the bore 50 and, in some embodiments, even secured to the ferrule 12 using a bonding agent (also referred to as an "adhesive composition"; not shown) before such processing takes place. Alternatively, such processing may take place prior to inserting and/or securing the optical fiber 40 in the ferrule 12.

With this in mind, various examples of devices and methods for processing the optical fiber will now be described. The processing is achieved with an electric arc apparatus having one or more first electrodes and one or more second electrodes. For example, FIG. 6 schematically illustrates one embodiment of an electric arc apparatus 100 that accommodates the optical fiber 40 extending along a longitudinal axis $A_1$. The optical fiber 40 is positioned by a support or body 102. A generic element supporting the optical fiber 40 is shown in FIG. 6 as the support 102, but as will be apparent from the description of other embodiments below, the electric arc apparatus 100 may alternatively or additionally include a body that is coupled to or part of an electrode and that defines a space through which the optical fiber 40 extends. The body in such embodiments may even serve as the support 102, positioning the optical fiber 40 along the longitudinal axis $A_1$. Again, embodiments will be described below to further illustrate these aspects.

The optical fiber 40 has an end 104 and a front facet/surface 106 with a profile characterized by roughness, cracks, scratches, undesirable geometry, or other physical attributes that would likely result in excessive attenuation if the front surface 106 was part of an optical coupling with another optical fiber or a device. The processing described below modifies the end 104 of the optical fiber 40 so that the front surface 106 has a smoother profile with a desired curvature and/or angle relative to the longitudinal axis $A_1$. For example, the processing may be used to make what is known in the optical communications industry as a physical contact (PC), superior physical contact (SPC), ultra physical contact (UPC), or angled physical contact (APC) polish. It should also be noted that FIG. 6 is not drawn to scale and that the initial profile of the front surface 106 may be closer to the desired profile. For example, a high precision cleaver (not shown) may be used prior to processing with the electric arc apparatus 100. Alternatively, low-precision cleaving may be performed with low-cost tools (e.g., scissors), or even without tools (e.g., looping the optical fiber 40 until the optical fiber 40 breaks), and optionally be followed by one or more preliminary polishing steps using polishing pads or other conventional devices prior to final processing with the electric arc apparatus 100.

The electric arc apparatus 100 includes a first electrode 110 and second electrode 112. The terms "first" and "second" in this context simply refer to the electrodes having different polarities at a given time. For example, the first electrode 110 may be electrically coupled to a positive terminal of a power source 114, such as a battery, and the second electrode 112 may be electrically coupled to a negative terminal of the power source 114 or to ground. Alternatively, the second electrode 112 may be electrically coupled to the positive terminal of the power source 114 while the first electrode 110 may be electrically coupled to the negative terminal or to ground. The power source 114 may supply direct current such that the first and second electrodes 110, 112 maintain their polarity, or alternating current such that the first and second electrodes 110, 112 switch polarity while current is supplied. The power source 114 may be a wall outlet, for example. Thus, references to positive and negative in the drawings and description below are merely for illustrative, non-limiting purposes. The power source 114 itself will not be illustrated in subsequent figures for convenience.

Only end portions of the first and second electrodes 110, 112 are shown in FIG. 6, and both the first and second electrodes 110, 112 are shown as being tip-shaped in the illustrated embodiment. Thus, at least the end portions of the first and second electrodes 110, 112 each converge to respective terminal ends 120, 122 in the form a rounded or pointed tip. In FIG. 6, the first and second electrodes 110, 112 are shown as being rod-shaped before each converges. Although not drawn to scale, the first and second electrodes 110, 112 may each have a diameter (or thickness, if not rod-shaped) between about 4 and about 12 times the diameter of the optical fiber 40 (e.g., between about 0.5 mm and about 1.5 mm for a 125 μm-diameter optical fiber) before converging.

In other embodiments, the first electrode 110 and/or second electrode 112 may only partially converge. As used herein, the language "at least partially converge" refers to an electrode narrowing in some manner before terminating. The narrowing may be a reduction in cross-sectional area that occurs gradually and/or in a step-like manner at one or more locations along a length of the electrode. Thus, although FIG. 6 illustrates the end portions of the first and second electrodes 110, 112 being tip-shaped, in alternative embodiments where an electrode at least partially converges, the corresponding terminal end may be a flat or spherical surface as long as the electrode has a reduction in cross-sectional area at one or more locations along its length. An electrode may even be hollow and converge to an opening defined by its terminal end in some embodiments, examples of which are described further below.

In the embodiment shown in FIG. 6, the first electrode 110 extends obliquely toward the longitudinal axis $A_1$. As used herein, the language "obliquely toward" refers to being slanted, inclined, or otherwise non-perpendicular and non-parallel to the longitudinal axis $A_1$. FIG. 6 illustrates the first electrode extending along a first electrode axis $A_{E1}$. Although the first electrode axis $A_{E1}$ intersects the longitudinal axis $A_1$, the first electrode 110 terminates at a first location spaced from the longitudinal axis $A_1$ by a distance $D_1$ measured perpendicular to the longitudinal axis $A_1$. The distance $D_1$ may be slightly larger than one half the diameter of the optical fiber 40, such as about 1-2 times larger. For example, $D_1$ may be between about 62.5 and about 125 μm for a 125 μm-diameter optical fiber. An angle $\alpha_1$ is formed between the longitudinal axis $A_1$ and first electrode axis $A_{E1}$ and, for embodiments like FIG. 6 where the first electrode 110 extends obliquely toward the longitudinal axis $A_1$, is something other than 0, 90, 180, or 360 degrees. Other embodiments where the first electrode axis $A_{E1}$ is parallel or perpendicular to the longitudinal axis $A_1$ are also possible.

Like the first electrode 110, the second electrode 112 is shown as being tip-shaped and has at least an end portion extending obliquely toward the longitudinal axis $A_1$. FIG. 6 illustrates the end portion of the second electrode 112 extending along a second electrode axis $A_{E2}$ that intersects the longitudinal axis $A_1$ at an angle $\alpha_2$. Although the second electrode 112 approaches the first electrode 110, the second electrode 112 terminates at a second location that is spaced from: a) the longitudinal axis $A_1$ by a distance $D_2$ measured perpendicular to the longitudinal axis $A_1$, and b) the first location in a direction parallel to the longitudinal axis $A_1$. The distance $D_1$ may be less than the distance $D_2$, as shown, or vice-versa. Additionally, in alternative embodiments, the second electrode 112 may extend along and/or terminate at the longitudinal axis $A_1$ (i.e., the distance $D_2$ may be zero) such that the second location is spaced from the first location in a direction along the longitudinal axis $A_1$. Regardless, the distance between the first and second locations in the direction parallel to or along the longitudinal axis $A_1$ defines an electrode gap, E. In some embodiments, the electrode gap E may be between about 4 and about 40 times the diameter of the optical fiber 40 (e.g., between about 0.5 mm and 5 mm for a 125 μm-diameter optical fiber).

The end 104 of the optical fiber 40 is positioned closer to the first electrode 110 than to the second electrode 112, even though the optical fiber 40 may extend to or beyond a transverse plane (i.e., perpendicular to the longitudinal axis $A_1$) including the terminal end 120 of the first electrode 110. FIG. 6 illustrates the end 104 of the optical fiber 40 being spaced from the terminal end 120 of the first electrode 110 by a distance $D_3$ measured parallel to the longitudinal axis $A_1$. As can be appreciated from the above statements, the distance $D_3$ may be less than half the electrode gap E. In some embodiments, the distance $D_3$ may even be less than one-fourth of the electrode gap E.

As schematically shown in FIGS. 6 and 7, the power source 114 may be activated to generate an electric arc between the first electrode 110 and second electrode 112. More specifically, the power source 114 provides a voltage that results in current flow through the electrode gap E. The current ionizes the air between the first electrode 110 and second electrode 120 to form a plasma field 130. The electric arc is a visible discharge of the current in the plasma field 130. Reference number 130 will be used in the remainder of the description to refer to both the electric arc and plasma field for convenience. In some embodiments, the power source 114 may be provided as part of the electric arc apparatus 100, as may be the case when the power source 114 is a rechargeable battery. In other embodiments, the power source 114 may be provided separately such that an individual couples the electric arc apparatus 100 to the power source 114 prior to use.

As can be seen in FIG. 7, the arrangement of the first and second electrodes 110, 112 results in the plasma field 130 being shaped to selectively heat the front surface 106 of the optical fiber 40. Nearby portions of the optical fiber 40, including nearby portions of an outer cylindrical surface 132, may be positioned largely or entirely outside of the plasma field 130. The heating of these portions is limited so that they retain or substantially retain their shape, as shown in FIG. 8. There is little or no "bulging" of the optical fiber 40 proximate the end 104; only the front surface 106 has been modified to have a different geometry. In this embodiment, the front surface 106 has been modified to have a slightly rounded profile with a height variance (measured parallel to the longitudinal axis $A_1$) less than 500 nm, or even less than 200 nm, consistent with a polishing operation.

Figure 9:
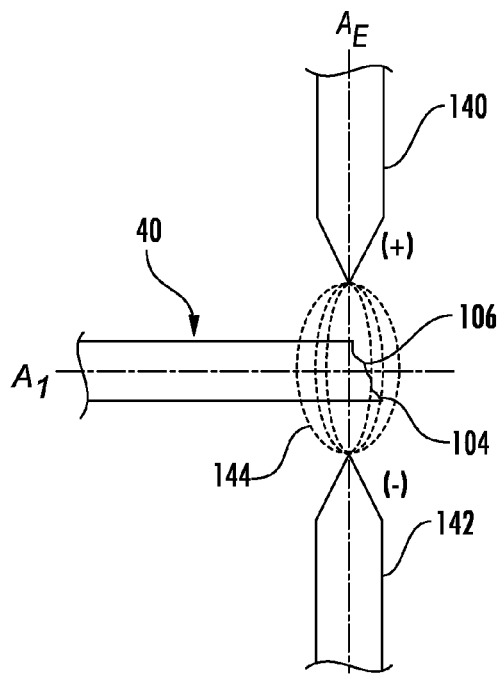
FIG. 9 is a schematic view of a conventional electric arc apparatus being used to process an end of an optical fiber.
Figure 10:
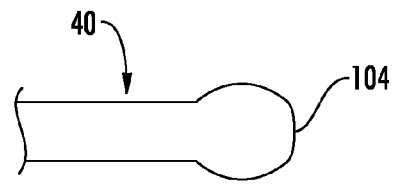
FIG. 10 is a schematic view of the optical fiber of FIG. 9 after having been processed with the conventional electric arc apparatus.

The advantages of the electric arc apparatus 100 can be further appreciated by making a comparison to FIGS. 9 and 10, which schematically illustrate a conventional arrangement of first and second electrodes 140, 142 processing the optical fiber 40. The first and second electrodes 140, 142 each include at least an end portion extending along a common electrode axis $A_E$ that is arranged perpendicular to the longitudinal axis $A_1$. When the optical fiber 40 is extended to or beyond a transverse plane including the common electrode axis $A_E$, both the end 104 and nearby portions of the optical fiber 40 extend into a plasma field 144 formed between the first and second electrodes 140, 142. The large amount of heat applied to these portions may result in the optical fiber 40 bulging or otherwise changing shape. This can be especially problematic if the optical fiber 40 has not yet been inserted into a ferrule whose bore is not sized to accommodate the bulging. Nevertheless, if such bulging is desired, which may be the case if the optical fiber 40 has already been inserted through a bore of a ferrule, the electric arc apparatus 100 (FIGS. 6 and 7) can still provide this functionality. In such embodiments, the end 104 of the optical fiber 40 may be extended past the terminal end 120 of the first electrode 110 and inserted further into the plasma field 130 (e.g., the distance $D_3$ in FIG. 6 may be greater, perhaps even more than half the electrode gap E).

Figure 11:
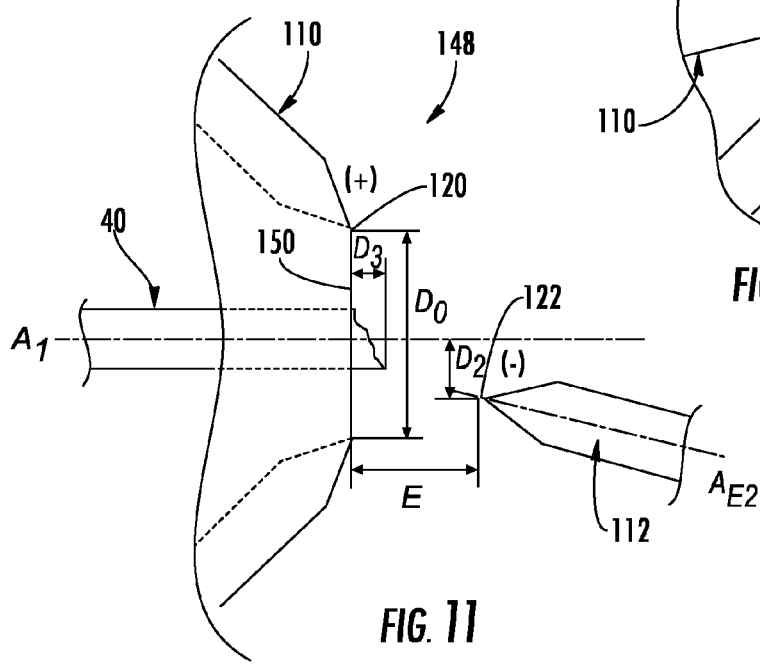
FIG. 11 is a schematic view of an embodiment of an electric arc apparatus that has a first electrode defining an opening configured to accommodate an optical fiber.

It was mentioned above how the language "at least partially converge" refers to an electrode narrowing in some manner before terminating, and that in some embodiments an electrode may converge to an opening defined at its terminal end. FIG. 11 illustrates an electric arc apparatus 148 as an example of such an embodiment. At least the end portion of the first electrode 110 in FIG. 11 partially or completely encircles the longitudinal axis $A_1$, thereby making the first electrode 110 at least partially hollow. An opening 150 defined by the first electrode 110 accommodates the optical fiber 40 extending along the longitudinal axis $A_1$. The opening 150 has a diameter or minimum width (if non-circular) $D_O$ that may only be slightly larger than the diameter of the optical fiber 40, such as about 1-2 times larger. For example, $D_O$ may be between about 125 μm and about 250 μm for a 125 μm-diameter optical fiber 40. The second electrode 112 may still terminate at a location closer to the longitudinal axis $A_1$ than the first electrode 110, similar to the embodiment shown in FIG. 6. Specifically, for the embodiment shown in FIG. 11, the second electrode 112 may terminate at a location closer to the longitudinal axis $A_1$ than a periphery of the opening 150 such that the distance $D_3$ is less than the diameter $D_O$.

Figure 12:
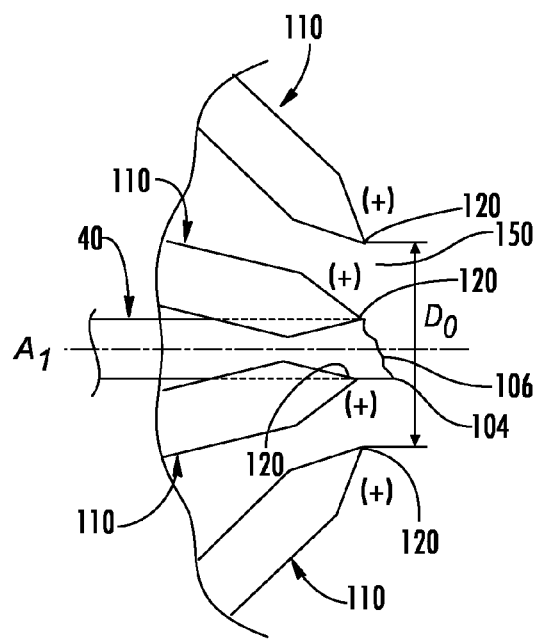
FIG. 12 is a schematic view of a portion of an electric arc apparatus according to another embodiment, wherein the electric arc apparatus has a plurality of first electrodes (or a single first electrode with a plurality of end segments) defining an opening configured to accommodate an optical fiber.

As shown in FIG. 12, embodiments are also possible where the opening 150 is defined by a plurality of first electrodes 110 rather than a single first electrode. The end portions of the first electrodes 110 are circumferentially distributed about the longitudinal axis $A_1$ so that their terminal ends 120 define the opening 150 through which the longitudinal axis $A_1$ extends. Thus, the opening 150 may not have a continuous periphery. Indeed, there may be as few as two first electrodes 110 defining the opening 150 in alternative embodiments.

The end portions shown in FIG. 12 may alternatively be segments of a single first electrode 110. For example, the end portions shown in FIG. 12 may extend from a common body (not shown) of the first electrode 110. Thus, even in embodiments where there is only a single first electrode, the opening 150 may be defined by a plurality of terminal ends 120.

Although the second electrode 112 is only shown as a single electrode in FIGS. 6, 7, 11, and 12, embodiments will be appreciated involving a plurality of second electrodes 112 or a single second electrode 112 with a plurality of end portions, similar to the first electrode 110 in FIG. 12.

The principles mentioned-above with reference to FIGS. 6-8, 11, and 12 can be summarized as follows. Methods of processing the optical fiber 40 according to this disclosure involve extending the optical fiber 40 along the longitudinal axis $A_1$. The first electrode(s) 110 of the electric arc apparatus 100 each at least partially converge before terminating and may even define an opening 150 through which the longitudinal axis $A_1$ extends. The second electrode(s) 112 each at least partially converge before terminating as well. The end 104 of the optical fiber 40 is positioned between the first and second electrodes 110, 112, and specifically between respective first and second locations where the first and second electrodes 110, 112 terminate. The second location is spaced from the first location in a direction along or parallel to the longitudinal axis $A_1$. With the optical fiber 40, first electrode(s) 110, and second electrode(s) 112 positioned in this manner, a voltage may be provided to either the first electrode(s) 110 or second electrode(s) 112 to generate the plasma field 130 between the first and second electrode(s) 110, 112 that modifies the end 104 of the optical fiber 40.

Additional examples that further illustrate the above-mentioned principles or variations thereof will now be described. The same reference numbers will be used to refer to elements corresponding to those already described in connection with FIGS. 6, 7, 11, and 12. Only the differences are mentioned to appreciate the modifications and variations.

Figure 13:
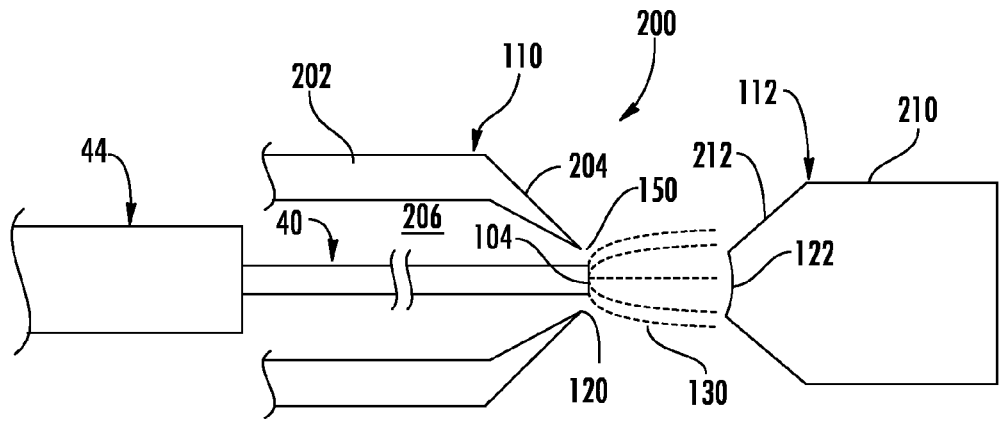
FIG. 13 is a schematic view of an electric arc apparatus according to yet another embodiment being used to process an end of an optical fiber.

To this end, FIG. 13 illustrates an embodiment of an electric arc apparatus 200 where the first electrode 110 includes a body 202 having a different shape than an end portion 204 of the first electrode 110. The body 202 defines a space 206 that accommodates the optical fiber 40 extending along the longitudinal axis $A_1$. As shown, the body 202 itself may extend in a direction parallel to the longitudinal axis $A_1$ and may have a center aligned with the longitudinal axis $A_1$. In this respect, the electric arc apparatus 200 (or at least part of the electric arc apparatus 200) may be considered to be co-axial with the optical fiber 40. The end portion 204 of the first electrode 110 still converges toward the opening 150 defined by the terminal end 120, and the opening 150 is still sized to allow the optical fiber 40 to pass therethrough.

The second electrode 112 in FIG. 13 includes a wide portion 210 and converging portion 212. The converging portion 212 provides a gradual transition from the wide portion 210 to the terminal end 122. Stated differently, the converging portion 212 extends both in a direction along the longitudinal axis $A_1$ and toward the longitudinal axis $A_1$ before defining the terminal end 122, which in the embodiment shown in a slightly concave surface having a reduced width/cross-sectional area compared to the wide portion 210. The presence of at least some convergence in the first electrode 110 and second electrode 112, and the relatively small electrode gap E, helps keep the plasma field 130 relatively small and focused so that its shape is easy to control/predict. Only a small plasma field is necessary due to the plasma field 130 intersecting the longitudinal axis $A_1$ such that the front surface 106 of the optical fiber 40 can be directly exposed to the plasma field 130. The ability to more accurately control/predict the plasma field 130 allows for processing in a more repeatable manner. Additionally, the small nature of the plasma field 130 means that the voltage required to generate the plasma field 130 can be kept relatively small.

Figure 14:
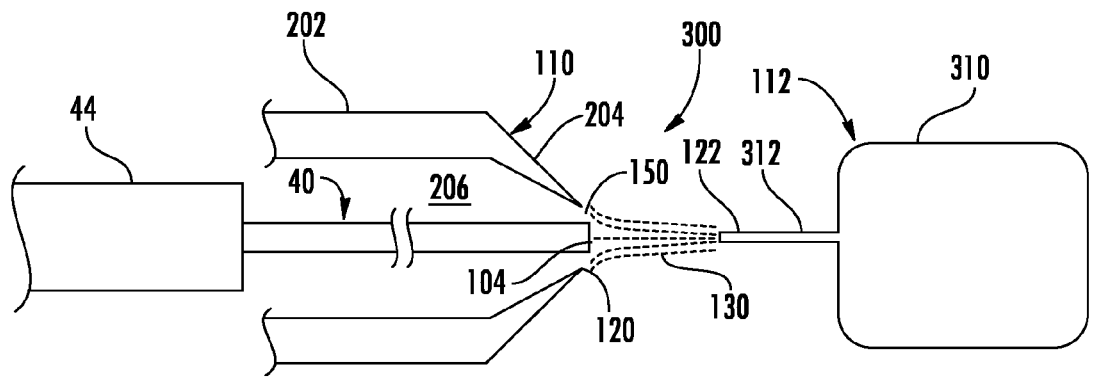
FIG. 14 is a schematic view of an electric arc apparatus according to yet another embodiment being used to process an end of an optical fiber.

FIG. 14 illustrates an electric arc apparatus 300 similar to the electric arc apparatus 20 of FIG. 13, but with the second electrode 112 having a different shape. In the embodiment shown in FIG. 14, the second electrode 112 still includes a wide portion 310, but the wide portion 310 has a single, step-like transition to a narrow portion 312 that includes the terminal end 122. Thus, the second electrode 112 is still considered to at least partially converge. In the particular embodiment shown, the narrow portion 312 extends along the longitudinal axis $A_1$ and has a relatively small width/thickness. Such an arrangement may be used to make the plasma field 130 more focused, especially near the terminal end 122.

Figure 15:
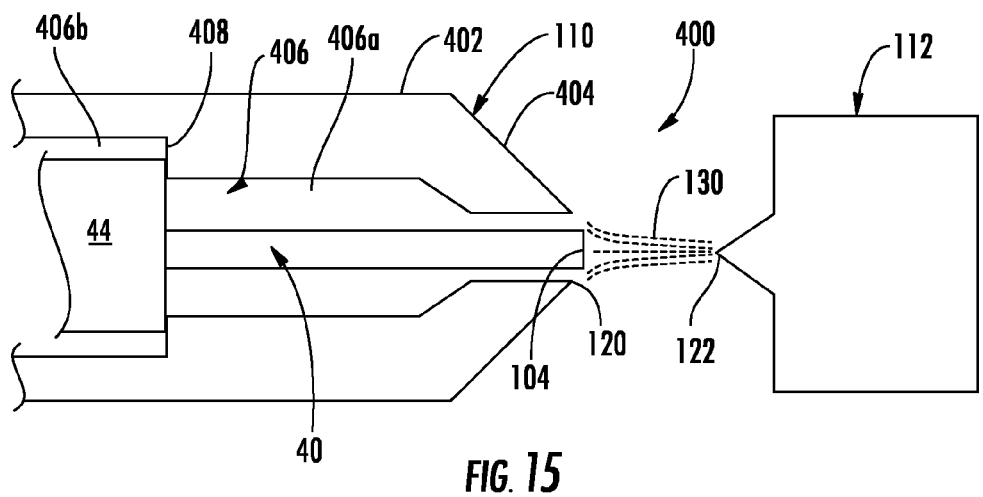
FIG. 15 is a schematic view of an electric arc apparatus according to yet another embodiment being used to process an end of an optical fiber.

FIG. 15 illustrates an electric arc apparatus 400 according to yet another example. In this embodiment, the first electrode 112 still includes a body 402 and an end portion 404, but a space 406 defined by the body 402 has at least two sections 406a, 406b with different diameters (or widths, for non-cylindrical bodies) measured perpendicular to the longitudinal axis $A_1$. A shoulder or stop 408 is defined at a transition between the sections 406a, 406b. The shoulder 408 may be used to help position the end 104 of the optical fiber 40 relative to the terminal end 120 of the first electrode 110. For example, the primary coating 42 (FIGS. 3 and 4) and tight buffer coating 44 may be removed from a predetermined length of the optical fiber 40. This predetermined length may be based on the distance between the shoulder 408 and terminal end 120 of the first electrode 110 plus the desired distance $D_3$ (if any; FIG. 11) for the end 104 of the optical fiber 40 to extend past the opening 150. In this regard, the optical fiber 40 may be inserted into the body 402 and moved along the longitudinal axis $A_1$ until the remaining tight buffer coating 44 abuts the shoulder 408. At this point the optical fiber 40 is prevented from advancing further within the body 402 and the end 104 is located in the desired position for processing with the electric arc apparatus 400.

Note that the end portion 404 of the first electrode 110 is shown as having a different shape than in previous embodiments. The second electrode 112 likewise has a different shape. Both, however, still at least partially converge before terminating. The different shapes are merely provided to further illustrate how many variants will be appreciated by skilled persons. Indeed, the shapes of the first and second electrodes 110, 112 may vary depending on the particular embodiment and desired shape of the plasma field 130.

Figure 16:
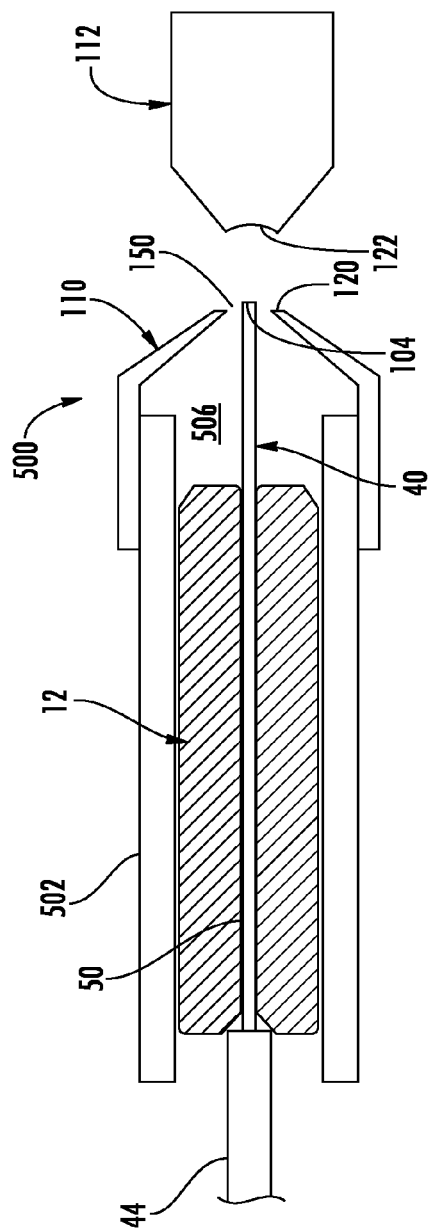
FIG. 16 is a schematic view of an electric arc apparatus having a body configured to receive a ferrule that has an optical fiber extending therethrough.

One of the possibilities mentioned above in connection with FIG. 5 was that the optical fiber 40 may be first inserted through the bore 50 of the ferrule 12 prior to being processed with an electric arc apparatus. In some embodiments, the electric arc apparatus may even be configured to accommodate a ferrule. For example, FIG. 16 illustrates an electric arc apparatus 500 having a body 502 defining a space 506 sized to receive the ferrule 12. The first electrode 110 is coupled to the body 502 such that the body 502 is not part of the first electrode 110 in this embodiment, although the body 502 could be part of the first electrode 110 if desired. As shown in FIG. 16, the body 502 may be a sleeve with the space 506 having a diameter that is greater than the diameter of the ferrule 12 (e.g., at least 1.25 mm for a 1.25 mm-diameter ferrule, at least 2.5 mm for a 2.5 mm-diameter ferrule, etc.). The diameter of the sleeve 506 may also be only slightly larger than the diameter of the ferrule 12, such as less than 1% larger, to provide a close fit and thereby serve as a support for the ferrule 12 and optical fiber 40.

Although not shown in FIG. 16, the space 506 may be similar to the space 406 (FIG. 15) by having two more sections with different diameters (or widths) measured perpendicular to the longitudinal axis $A_1$. A transition between two of the sections in such embodiments may define a shoulder or stop, like the shoulder 408, configured to prevent further movement of the ferrule 12 toward the first electrode 110 after the ferrule 12 has been inserted into the body 502.

Figure 17:
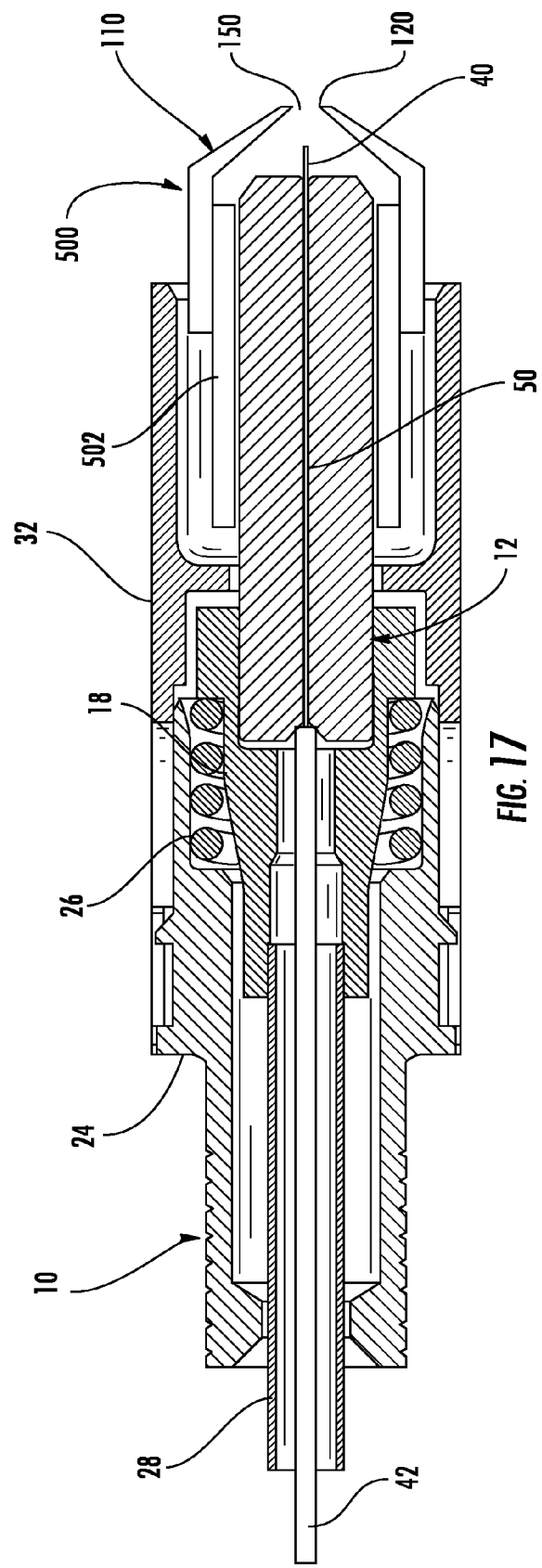
FIG. 17 is a schematic view of a portion of the electric arc apparatus of FIG. 16 being received in a space between a ferrule and housing of a fiber optic connector.

FIG. 17 illustrates how the body 502 may even be configured to accommodate the ferrule 12 when the ferrule 12 is assembled as part of the connector 10. In particular, the body is configured to be received in a space between the ferrule 12 and a housing, such as the outer housing 32, of the connector 10. Thus, the connector 10 may be fully assembled before processing the optical fiber 40 with the electric arc apparatus 500.

Figure 18:
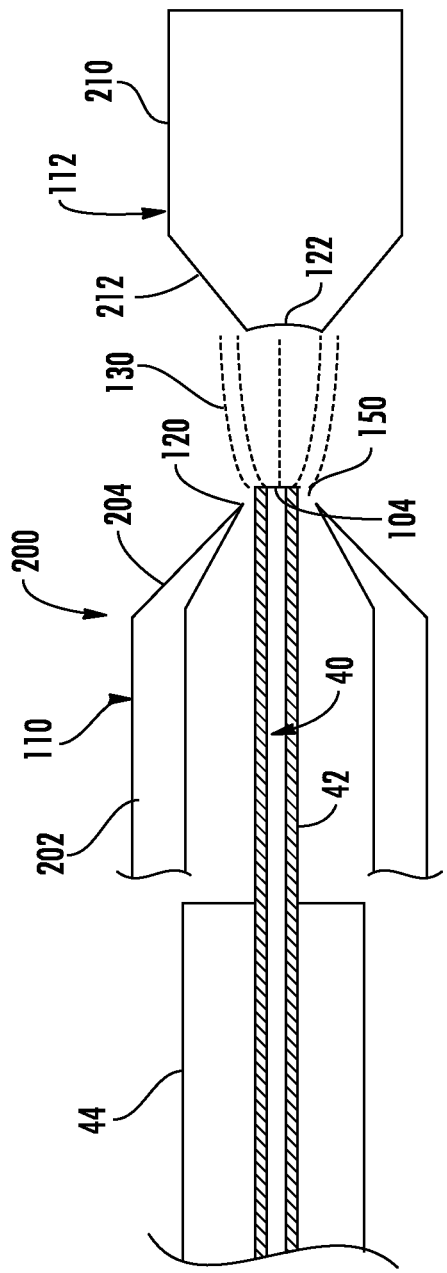
FIG. 18 is a schematic view of an electric arc apparatus being used to process an optical fiber that still includes a primary coating.

Persons skilled in optical connectivity will appreciate additional variations and modifications of the apparatuses and methods already described. Again, the electric arc apparatuses 200, 300, 400, and 500 are merely examples that further illustrate variations and modifications of the general principles discussed in connection with the electric arc apparatuses 100 and 148. Although different methods are not described for the electric arc apparatuses 200, 300, 400, and 500, variations will nonetheless be appreciated. For example, FIG. 18 illustrates how an electric arc apparatus, such as the electric arc apparatus 200, may be used to process the end of an optical fiber 40 that has not been stripped of the primary coating 42. Accordingly, where a method claim below does not explicitly recite a step mentioned in the description above, it should not be assumed that the step is required by the claim. Additionally, where a method claim below does not actually recite an order to be followed by its steps or an order is otherwise not required based on the claim language, it is no way intended that any particular order be inferred.

What is claimed is:

1. A method of processing an optical fiber, comprising:
   extending the optical fiber along a longitudinal axis, wherein the longitudinal axis extends through an opening defined by a first electrode of an electric arc apparatus, and wherein the first electrode is at least partially hollow such that the optical fiber extends along the longitudinal axis within the first electrode;
   positioning an end of the optical fiber closer to the first electrode than to one or more second electrodes of the electric arc apparatus, wherein the one or more second electrodes each terminate at a location spaced from the opening defined by the first electrode; and
   providing a voltage to the first electrode or the one or more second electrodes to generate a plasma field between the first electrode and the one or more second electrodes, wherein the plasma field is focused by the first electrode and the one or more second electrodes so that the plasma field extends across the longitudinal axis and modifies the end of the optical fiber.

2. A method according to claim 1, wherein providing a voltage comprises activating a power source that is electrically coupled to the first electrode, the one or more second electrodes, or both the first electrode and the one or more second electrodes.

3. A method according to claim 1, wherein the first and second locations are positioned so that a first portion of the plasma field extends between the first location and the end of the at least one optical fiber and a second portion of the plasma field extends between the second location and the end of the at least one optical fiber, and wherein the first portion of the plasma field is smaller than the second portion of the plasma field.

4. A method according to claim 1, wherein the first electrode includes segments defining the opening such that the opening does not have a continuous periphery.

5. A method according to claim 1, wherein the optical fiber has a diameter of about 125 μm, and further wherein the opening defined by the first electrode has a diameter or minimum width between about 125 μm and about 250 μm.

6. A method according to claim 1, wherein:
   a distance between the first and second locations, when measured in a direction parallel to or along the longitudinal axis, defines an electrode gap; and
   during the processing step, the end of the optical fiber is spaced from a terminal end of the first electrode by a distance, measured parallel to the longitudinal axis, that is less than half the electrode gap.

7. A method according to claim 1, wherein the first electrode at least partially converges before terminating at the opening, and further wherein the one or more second electrodes each at least partially converges before terminating at the location spaced from the opening.

8. A method according to claim 7, further comprising:
   extending the optical fiber through a bore of a ferrule before positioning the optical fiber relative to the first electrode and the one or more second electrodes.

9. A method according to claim 8, wherein the electric arc apparatus includes a body coupled to or integrally formed with the first electrode, the method further comprising:
   inserting the ferrule into a space defined by the body of the electric arc apparatus after extending the optical fiber through the bore of the ferrule.

10. A method according to claim 9, wherein the space defined by the body of the electric arc apparatus has at least two sections with different widths measured perpendicular to the longitudinal axis, and wherein inserting the ferrule into the space further comprises:
    abutting an internal stop formed by the different widths of the space so that the ferrule is prevented from being inserted beyond a predetermined location within the body.

11. A method of processing at least one optical fiber with an electric arc apparatus having a plurality of first electrodes and one or more second electrodes, the method comprising:

extending the at least one optical fiber along a longitudinal axis, wherein the plurality of first electrodes each terminate at a first location spaced from the longitudinal axis and are circumferentially distributed about the longitudinal axis, and further wherein each of the first electrodes is non-perpendicular and non-parallel to the longitudinal axis;

positioning an end of the at least one optical fiber closer to the one or more first electrodes than to the one or more second electrodes while the optical fiber extends along the longitudinal axis, wherein the one or more second electrodes terminates at a second location that is spaced from the first location in a direction along or parallel to the longitudinal axis; and providing a voltage to the plurality of first electrodes or the one or more second electrodes to generate a plasma field between the first and second locations, wherein the first and second locations are positioned so that the plasma field intersects the longitudinal axis, and wherein the plasma field modifies the end of the at least one optical fiber.

12. A method according to claim 11, wherein the first and second locations are positioned so that a first portion of the plasma field extends between the first location and the end of the at least one optical fiber and a second portion of the plasma field extends between the second location and the end of the at least one optical fiber, and wherein the first portion of the plasma field is smaller than the second portion of the plasma field.

13. A method according to claim 11, wherein:
the optical fiber has a diameter of about 125 µm;
the plurality of first electrodes define an opening through which the longitudinal axis extends; and
the opening has a diameter or minimum width between about 125 µm and about 250 µm.

14. A method according to claim 11, wherein:
a distance between the first and second locations, when measured in a direction parallel to or along the longitudinal axis, defines an electrode gap; and
during the processing step, the end of the optical fiber is spaced from a terminal end of the first electrode by a distance, measured parallel to the longitudinal axis, that is less than half the electrode gap.

15. A method according to claim 11, wherein the plurality of first electrodes at least partially converge before terminating at the first location, and further wherein the one or more second electrodes each at least partially converges before terminating at the second location.

16. A method according to claim 15, further comprising:
extending the at least one optical fiber through at least one bore of a ferrule before positioning the at least one optical fiber relative to the plurality of first electrodes and the one or more second electrodes.

17. A method according to claim 15, wherein the electric arc apparatus includes a body coupled to or integrally formed with the plurality of first electrodes, the method further comprising:
inserting the ferrule into a space defined by the body of the electric arc apparatus after extending the at least one optical fiber through the at least one bore of the ferrule.

18. A method according to claim 17, wherein the space defined by the body of the electric arc apparatus has at least two sections with different widths measured perpendicular to the longitudinal axis, and wherein inserting the ferrule into the space further comprises:
abutting an internal stop formed by the different widths of the space so that the ferrule is prevented from being inserted beyond a predetermined location within the body.

* * * * *